United States Patent [19]
Huang

[11] Patent Number: 5,985,717
[45] Date of Patent: Nov. 16, 1999

[54] METHOD OF FABRICATING A SEMICONDUCTOR DEVICE

[75] Inventor: Heng-Sheng Huang, Taipei, Taiwan

[73] Assignee: United Microelectronics Corp., Hsinchu City, Taiwan

[21] Appl. No.: 08/642,944

[22] Filed: May 6, 1996

[51] Int. Cl.⁶ ................................................. H01L 21/336
[52] U.S. Cl. .................... 438/262; 438/263; 438/276; 438/278; 438/594
[58] Field of Search ................................. 438/262, 263, 438/276, 278, 594

[56] References Cited

U.S. PATENT DOCUMENTS

| | | | |
|---|---|---|---|
| 4,647,340 | 3/1987 | Szluk et al. ............................... | 438/281 |
| 4,818,715 | 4/1989 | Chao ........................................ | 438/595 |
| 4,906,589 | 3/1990 | Chao ........................................ | 438/595 |
| 5,082,794 | 1/1992 | Pfiester et al. ........................... | 438/289 |
| 5,119,153 | 6/1992 | Korman et al. .......................... | 257/341 |
| 5,164,814 | 11/1992 | Okumura ................................. | 257/390 |
| 5,378,646 | 1/1995 | Huang et al. ............................ | 438/595 |
| 5,545,580 | 8/1996 | Sheng et al. ............................ | 438/276 |
| 5,739,056 | 4/1998 | Pan ......................................... | 438/595 |

*Primary Examiner*—John F. Niebling
*Assistant Examiner*—Lynne A. Gurley
*Attorney, Agent, or Firm*—Pillsbury Madison & Sutro LLP

[57] ABSTRACT

Disclosed is a method of fabricating memory devices. By the method, a silicon nitride layer is used as a mask to form oxide layers on the lateral sides of the word lines through high-temperature heat treatment as source/drain annealing or oxidation. An etching process is subsequently used to remove the silicon nitride layer so as to expose the polysilicon layer on the word lines. After that, metal, preferably aluminum, is selectively grown the exposed polysilicon layer, which allows the resistance of the word lines to be significantly lowered thereby increasing access speed of the memory device.

12 Claims, 4 Drawing Sheets

METHOD OF FABRICATING A SEMICONDUCTOR DEVICE

BACKGROUND OF THE INVENTION

1. Field of the Invention

The present invention relates to fabrication of semiconductor devices, and more particularly, to a method for fabricating semiconductor memory devices.

2. Description of Prior Art

Memory devices have become indispensable and also the most widely used device in computer-related systems. In the current information age, memory devices are compact in package with high storage capacity and processing speed. A non-volatile memory device is one that retains its data even when it is not supplied with power. This characteristic allows the non-volatile memory device to serve as a fixed data storage device that permanently stores repeatedly used programs and/or tables of data.

Conventional methods for fabricating non-volatile memory devices involve many steps which are complicated and time-consuming to perform. In general, most non-volatile memory devices are similar in structure except for the specific data to be permanently stored therein. Accordingly, a semiconductor manufacturer usually fabricates the nonvolatile memory device to a semi-finished product without performing the factory-programming step to store the permanent data. The semi-finished product is then stocked in a warehouse waiting for a customer order. After a customer-specified programming is received, the factory-programming step is then performed. This allows the non-volatile memory device product to be delivered to the customer in a short time. Alternatively, some sophisticated customers prefer to program the semi-finished product themselves. Thus, the un-programmed semi-finished product is delivered to the customer.

FIG. 1 (Prior Art) is a top view of a conventional non-volatile semiconductor memory device, which is a mask-programmed read-only memory (ROM) device having buried bit lines. This ROM device includes lengthwise interleaved source/drain areas 10, 11, 12, 13 (referred to as "buried bit line") and crosswise interleaved polysilicon gate areas 20, 21, 22, 23 (referred to as "word line"). Suppose that the data readout operation is to be performed on a memory cell 55, a high voltage is fed to the word line 21 and to bit line 11. A low voltage is fed to the bit line 12. By conventional methods the word lines have high resistance and an RC delay will be high if the distance between the memory cell 55 and the voltage source is too long. This delay will cause the data readout operation to be slow and overall system efficiency is affected.

There is a need to enhance the performance of the non-volatile memory devices. Various approaches have been tested, but none of them provide a perfect solution to the high-resistance problem that causes signal delays in the word lines. Another approach is to use a substrate of different material such as GaAs which allows the transistors thus fabricated to have higher switching speed than those fabricated based on a silicon substrate, whereby the data readout speed from the ROM device is enhanced. However, in this approach the aforementioned high-resistance problem which causes signal delay on the word lines still exists. The signal delay is a result of RC delay due to high resistance of the word lines and the capacitance of the insulators and which is existent regardless of which material is used as the substrate.

SUMMARY OF THE INVENTION

It is therefore a primary objective of the present invention to provide a method of fabricating non-volatile memory devices which have word lines of low-resistance so as to enhance memory access speed.

In accordance with the foregoing and other objectives of the present invention, there is provided a new and improved method of fabricating non-volatile memory devices. The method comprises the following steps:

preparing a substrate made of silicon;

forming a plurality of bit lines and word lines on the substrate;

forming an isolation layer on the word lines;

forming a lateral oxidation layer on lateral sides of the word lines;

removing the isolation layer; and forming a metal layer on the word lines so as to reduce the resistance of the word lines.

In preferred embodiments, the isolation layer is made of silicon nitride for preventing the forming of an oxidation layer upon the word lines in subsequent steps. The lateral oxidation layer is formed by using the silicon nitride layer as a mask. The metal layer can be made of aluminum, titanium, or other suitable materials. An optional step of low-temperature dielectric planarization process can be included, which utilizes TEOS/$O_3$ oxide or SOG. The word lines are made of polysilicon layers or metallic polysilicon composition layer.

BRIEF DESCRIPTION OF DRAWINGS

The present invention can be more fully understood by reading the subsequent detailed description of the preferred embodiments thereof with references made to the accompanying drawings, wherein.

DETAILED DESCRIPTION OF PREFERRED EMBODIMENT

Figure 1:
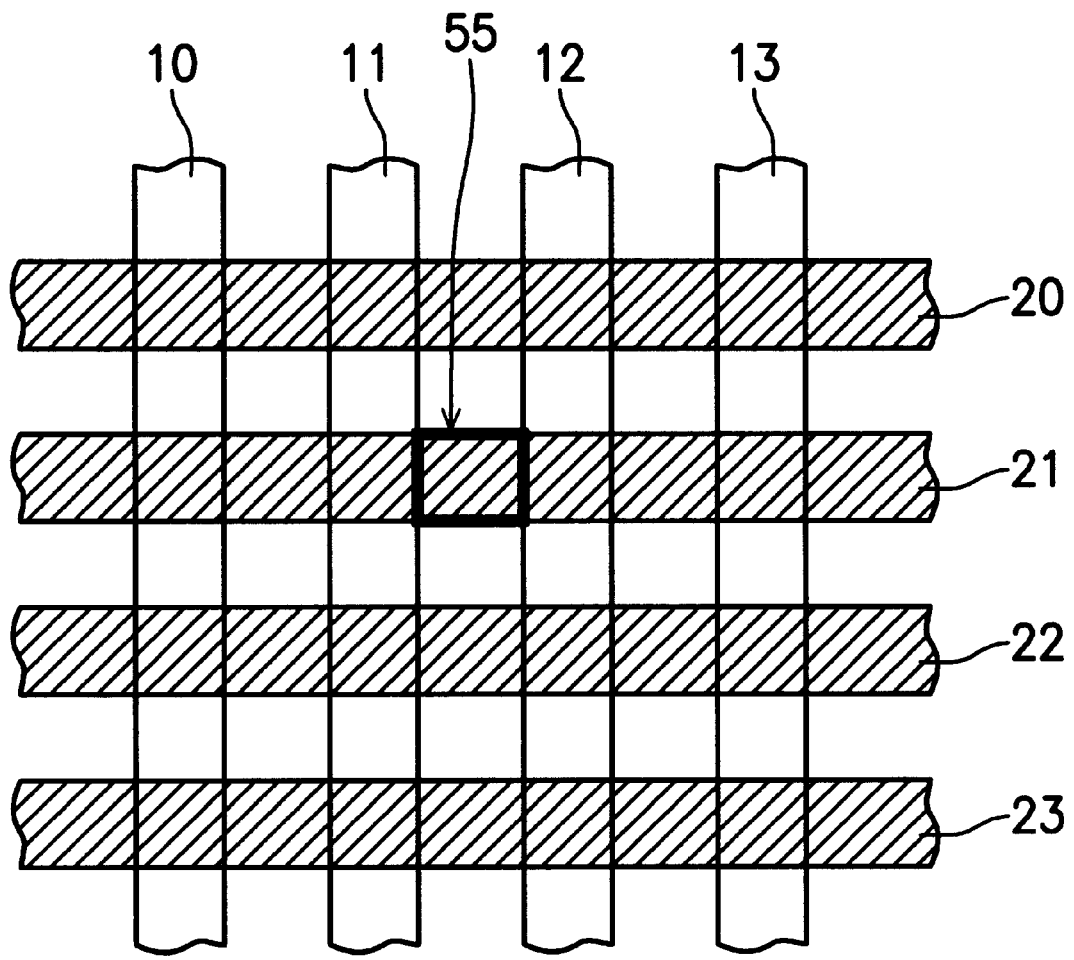
FIG. 1 (Prior Art) is a schematic top view of a conventional mask-programmed read-only memory (ROM) device having buried bit lines.
Figure 2A:
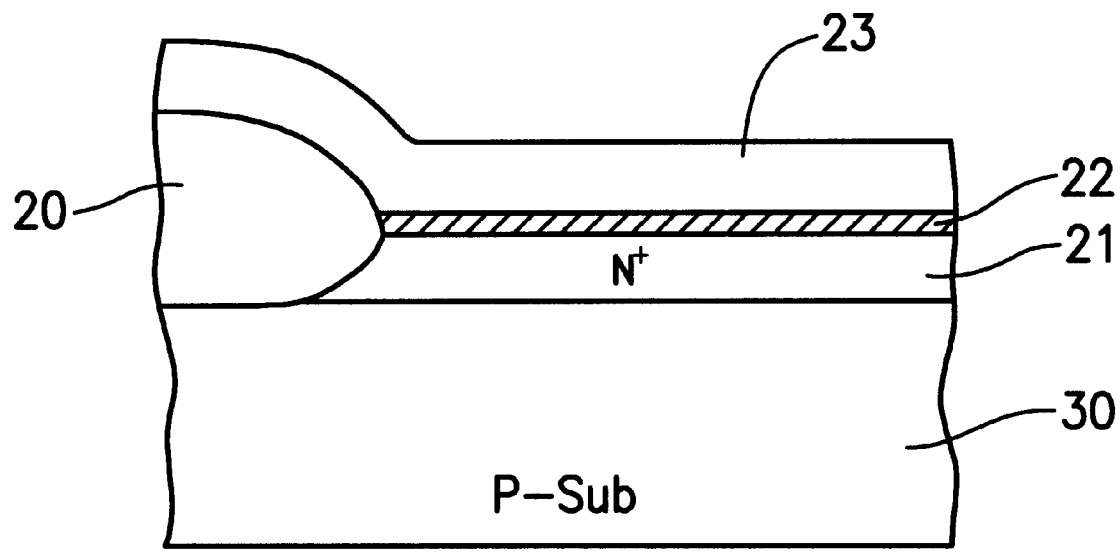
FIGS. 2A–2F are schematic sectional views showing the steps involved in the method according to the present invention for fabricating a non-volatile memory device.
Figure 2B:
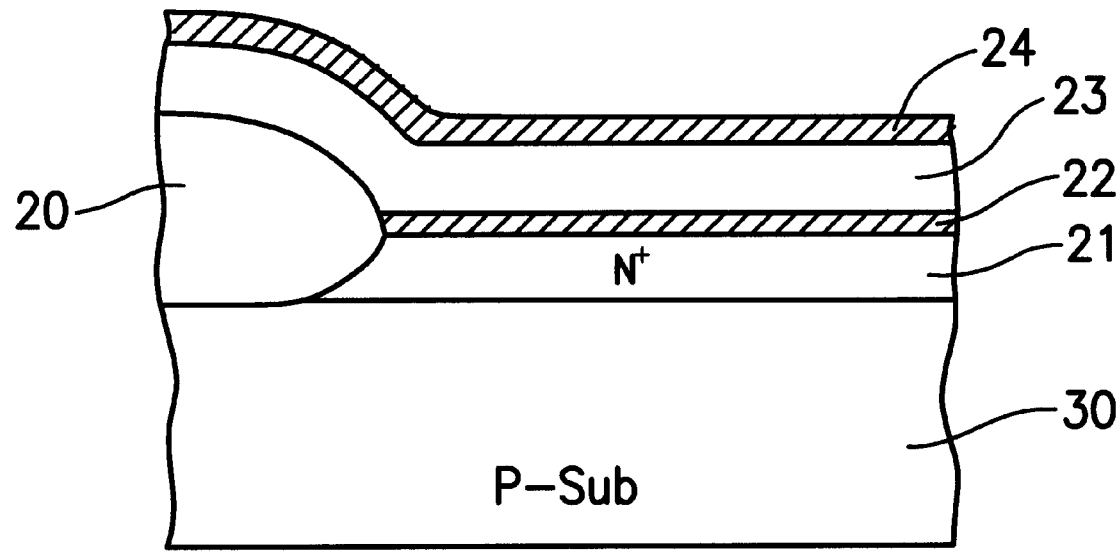
Figure 2C:
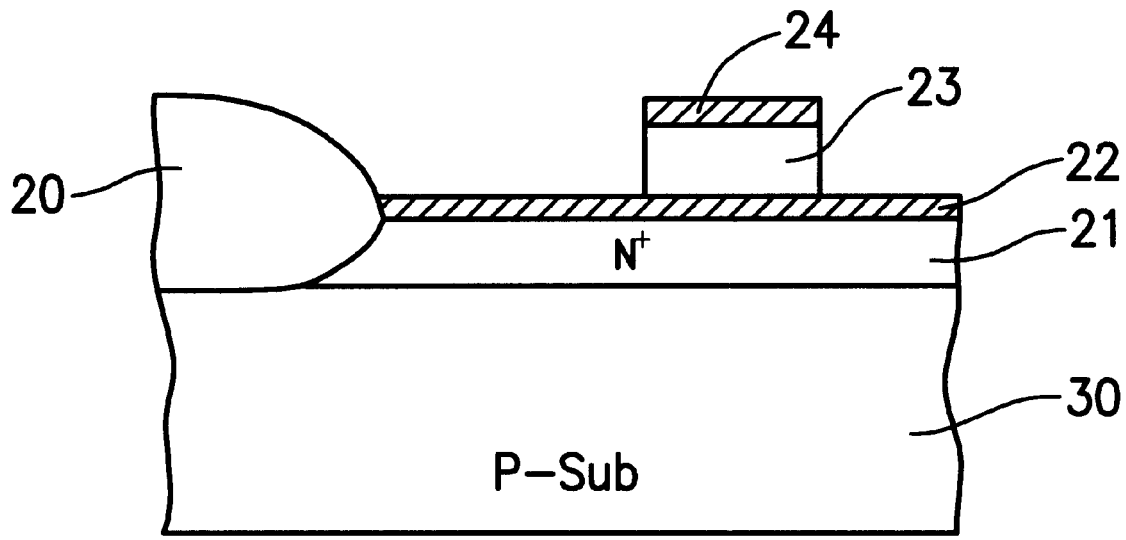
Figure 2D:
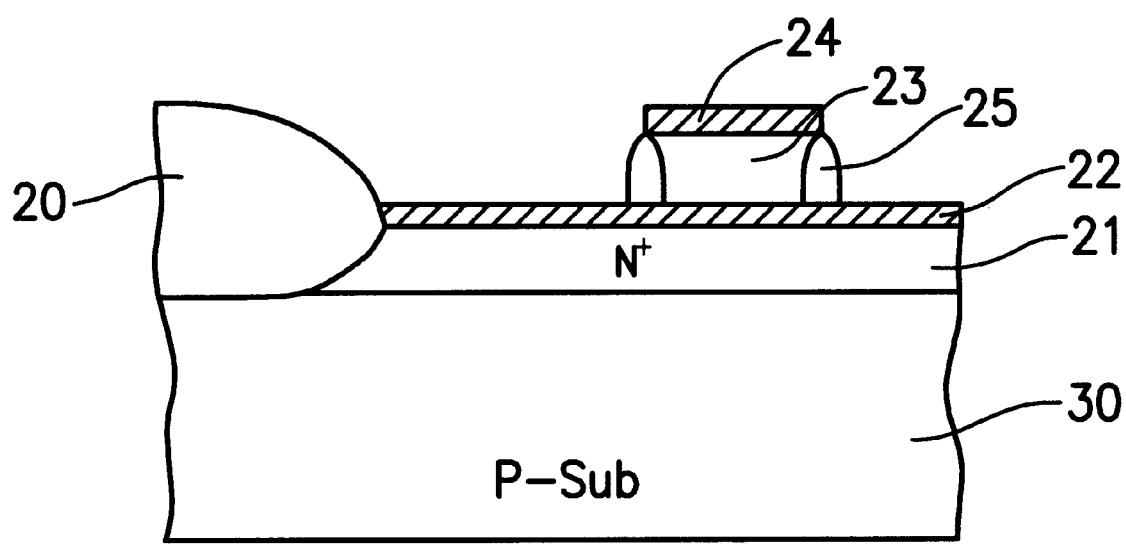
Figure 2E:
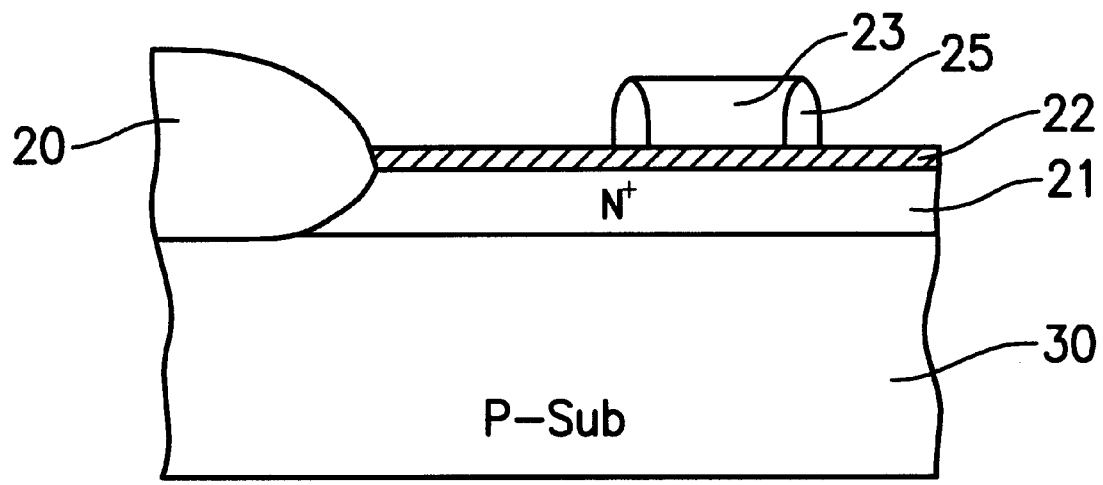

FIGS. 2A–2F are schematic sectional views showing the various steps according to the present invention for fabricating a mask-programmed read-only memory (ROM) device having buried bit lines. The initial fabrication steps are shown in FIG. 2A. Fabrication begins by providing a P-type silicon substrate 30. By standard processes an oxidation layer 20, bit line areas 21, and a gate oxidation layer 22 are formed successively on the silicon substrate 30. After that, a polysilicon gate layer 23 is deposited upon the gate oxidation layer 22. As shown in FIG. 2B, in the next step a silicon nitride layer 24 serving as an isolation layer is deposited upon the polysilicon gate layer 23. In the next steps, shown in FIG. 2C, a photoresist layer (not shown) is coated on the areas where the word lines are to be formed. The uncovered areas of the polysilicon gate layer 23 and silicon nitride layer 24 are etched away. As shown in FIG. 2D, the silicon nitride layer 24 is used as a mask for subsequent thermal cycle such as source/drain gate annealing or oxidation. That cycle forms a lateral oxidation layer 25 on the lateral sides of the polysilicon gate layer 23. Because the polysilicon gate layer 23 is protected by the silicon nitride layer 24, the oxidation layer will not be formed thereon. A wet etching process is performed to remove the silicon nitride layer 24 from the polysilicon gate layer 23 so as to expose the polysilicon gate layer 23 as shown in FIG. 2E.

Figure 2F:
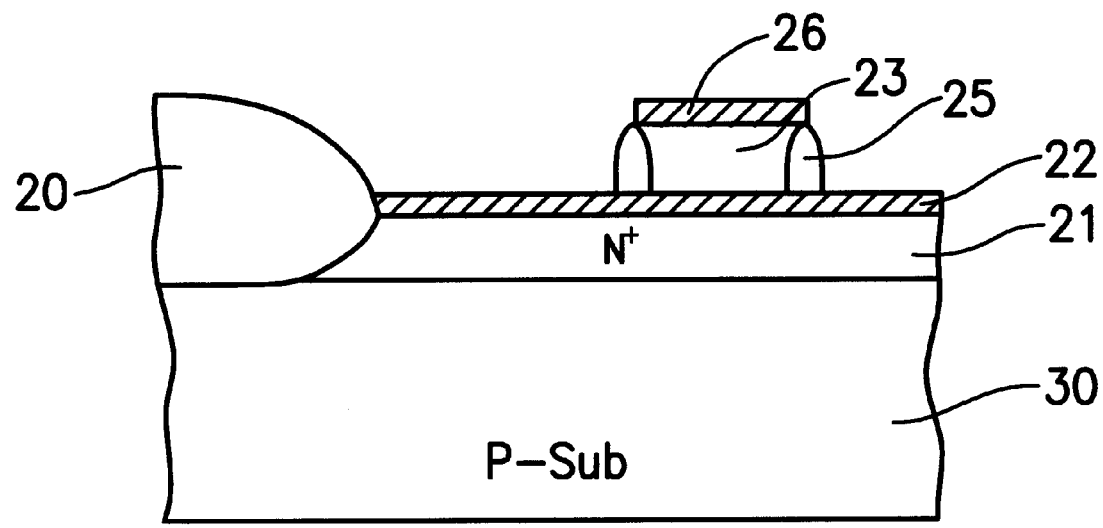

In the final step, shown in FIG. 2F, a selective metal growth process is performed. In the preferred embodiment, aluminum is selected as the metal for the growth. The aluminum has a characteristic that it reacts with silicon and not with oxides. Therefore, an aluminum layer 26 is formed on the polysilicon gate layer 23. The formation of the aluminum layer 26 allows a reduction in the resistance of the polysilicon gate layer 23 which serves as the word lines of the memory device. Because aluminum is used, the temperature should be less than 450° C. The subsequent dielectric planarization process, therefore, should be a low-temperature process, in which TEOS/$O_3$ oxide or SOG can be utilized for the low-temperature process. The subsequent steps involved in completing the fabrication of the memory device are all conventional techniques which any one skilled in the art of semiconductor fabrication should be able to perform without significant experimentation. Therefore, detailed description thereof will not be given.

Of course, various alternatives to the specific method described above are possible. For example, the polysilicon gate layer 23 described above can be doped with impurities or a metallic polycide. The lateral oxidation layer 25 shown in FIG. 2D, could be formed by using a spacer process. Also, the metal used for the selective metal growth is not limited to aluminum. Other metals such as titanium can be used. However, the use of the aluminum is, at this time, the most preferable because it is so widely used in IC fabrication processes to form electrical contacts and interconnects. The low resistance of the aluminum also makes it the suitable metal for use.

A memory device fabricated in accordance with the present invention has significant advantages. First, the resistance of the word lines is significantly lowered so as to reduce RC delay. Access to the memory device is therefore faster. Second, the size of a memory device fabricated according to this invention is the same as that of devices fabricated according to conventional techniques. This allows the memory device remain competitive on the IC markets.

The present invention has been described with exemplary preferred embodiments. However, it is to be understood that the scope of the present invention need not be limited to the disclosed preferred embodiments. On the contrary, it is intended to cover various modifications and similar arrangements within the scope defined in the following appended claims, such as the alternatives described above. The scope of the claims should be accorded the broadest interpretation so as to encompass all such modifications and similar arrangements.

What is claimed is:

1. A method of fabricating a memory device, comprising the steps of:

(1) preparing a substrate made of silicon;

(2) forming a plurality of bit lines and word lines on the substrate;

(3) forming an isolation layer on the word lines;

(4) forming a lateral oxidation layer on lateral sides of the word lines, wherein said oxidation layer remains on the lateral sides;

(5) removing the isolation layer; and (6) forming a metal layer on the word lines so as to reduce the resistance of the word lines.

2. A method as claimed in claim 1, wherein step (3) comprises the step of forming the isolation layer of silicon nitride to prevent the formation of an oxidation layer upon the word lines in subsequent steps.

3. A method as claimed in claim 2, wherein step (4) comprises the step of forming the lateral oxidation layer by using the silicon nitride layer as a mask.

4. A method as claimed in claim 2, wherein step (4) comprises the step of forming the lateral oxidation layer by carrying out a spacer process using the silicon nitride layer as a mask.

5. A method as claimed in claim 2, wherein step (6) comprises the step of forming the metal layer of aluminum.

6. A method as claimed in claim 2, wherein step (6) comprises the step of forming the metal layer of titanium.

7. A method as claimed in claim 5, further comprising steps for carrying out a low-temperature dielectric planarization process.

8. A method as claimed in claim 7, wherein the low-temperature dielectric planarization process utilizes TEOS/$O_3$ oxide.

9. A method as claimed in claim 7, wherein the low-temperature dielectric planarization process utilizes SOG.

10. A method as claimed in claim 2, wherein the step of forming word lines comprises the step of forming word lines of polysilicon layers.

11. A method as claimed in claim 2, wherein the step of forming word lines comprises the step of forming word lines of metallic polysilicon composition layer.

12. A method of fabricating a memory device, comprising the steps of:

(1) preparing a substrate made of silicon;

(2) forming a plurality of bit lines and word lines on the substrate;

(3) forming an isolation layer on the word lines;

(4) forming a lateral oxidation layer on lateral sides of the word lines;

(5) removing the isolation layer; and (6) forming a metal layer on the word lines having the lateral oxidation layer on the lateral sides of the word lines, so as to reduce the resistance of the word lines.

\* \* \* \* \*